United States Patent
Zorenko et al.

(10) Patent No.: US 12,389,725 B2
(45) Date of Patent: Aug. 12, 2025

(54) COMPOSITE WAVELENGTH CONVERTER

(71) Applicant: Friedrich-Alexander-Universität Erlangen-Nürnberg, Erlangen (DE)

(72) Inventors: Yuriy Zorenko, Bydgoszcz (PL); Miroslaw Batentschuk, Nuremberg (DE); Christoph Brabec, Nuremberg (DE); Andres Osvet, Erlangen (DE); Vitalii Gorbenko, Bydgoszcz (PL); Ievgen Levchuk, Erlangen (DE); Tetiana Zorenko, Bydgoszcz (PL); Liudmyla Chepyga, Utrecht (NL); Anton Markovskyi, Bydogoszcz (PL); Sandra Witkiewicz-Lukaszek, Osielsko (PL)

(73) Assignee: Friedrich-Alexander-Universität Erlangen-Nürnberg (DE)

( * ) Notice: Subject to any disclaimer, the term of this patent is extended or adjusted under 35 U.S.C. 154(b) by 370 days.

(21) Appl. No.: 17/775,772

(22) PCT Filed: Dec. 1, 2020

(86) PCT No.: PCT/EP2020/084134
§ 371 (c)(1),
(2) Date: May 10, 2022

(87) PCT Pub. No.: WO2021/110681
PCT Pub. Date: Jun. 10, 2021

(65) Prior Publication Data
US 2022/0393080 A1    Dec. 8, 2022

(30) Foreign Application Priority Data
Dec. 5, 2019  (EP) .................................. 19213887

(51) Int. Cl.
*H10H 20/851* (2025.01)
*C30B 19/04* (2006.01)
(Continued)

(52) U.S. Cl.
CPC ......... *H10H 20/8513* (2025.01); *C30B 19/04* (2013.01); *C30B 19/12* (2013.01);
(Continued)

(58) Field of Classification Search
CPC . H01L 33/504; H01L 2933/004; C30B 19/04; C30B 19/12; C30B 29/28; C30B 31/04; G02B 5/208
See application file for complete search history.

(56) References Cited

U.S. PATENT DOCUMENTS

2004/0256974 A1* 12/2004 Mueller-Mach ... C09K 11/7774
313/485
2009/0072710 A1* 3/2009 Schmidt ............. C09K 11/7731
313/503
(Continued)

FOREIGN PATENT DOCUMENTS

EP    2670817 B1    1/2018

OTHER PUBLICATIONS

Gorbenko, V. et al., "Luminescence of Ce3+ multicenters in Ca2+-Mg2+-Si4+ based garnet phosphors," Journal of Luminescence, Mar. 2018, pp. 245-250, vol. 199. XP055666887.
(Continued)

Primary Examiner — Monica D Harrison
Assistant Examiner — Andre C Stevenson
(74) Attorney, Agent, or Firm — Lerner David LLP

(57) ABSTRACT

The invention refers to a composite wavelength converter (1) for an LED (100), comprising a substrate (10) and an epitaxial film (20) formed by liquid phase epitaxy on the top and bottom of the substrate (10). Furthermore, the invention
(Continued)

Figure 1:
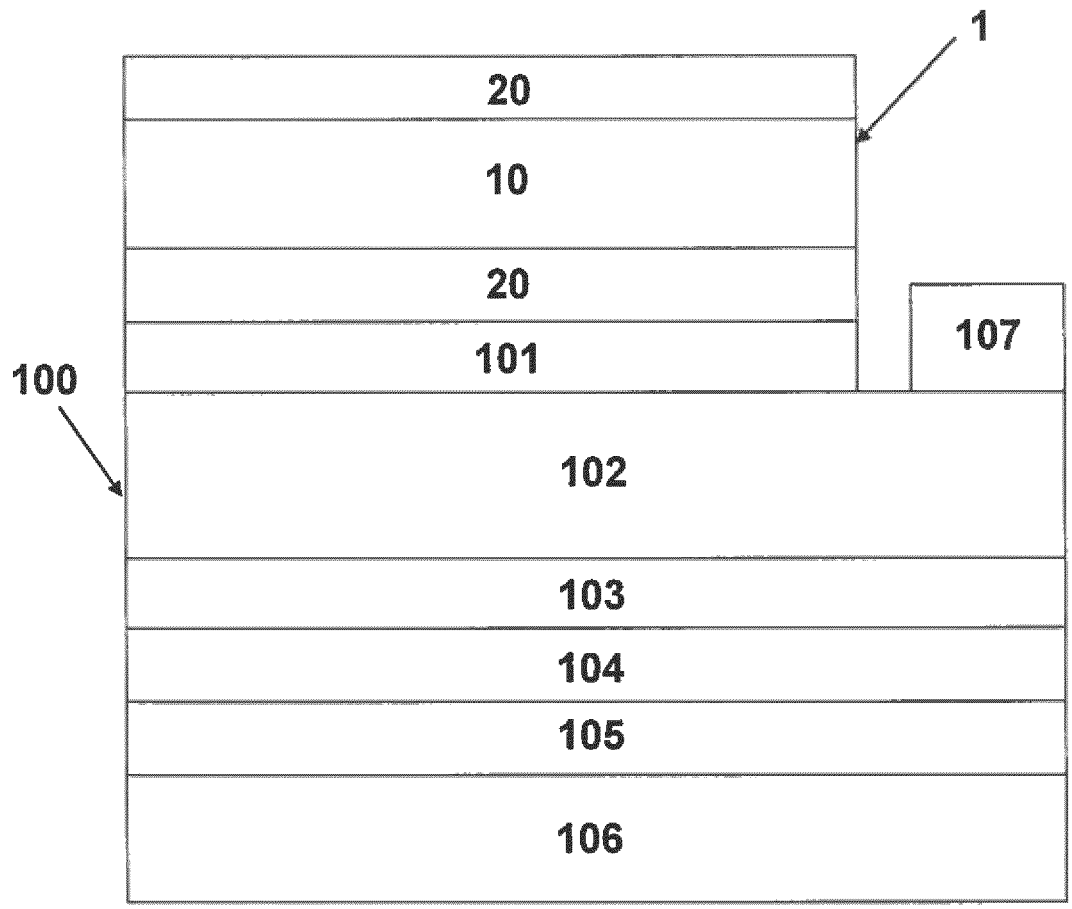

refers to a method of preparation of a composite wavelength converter (1) for an LED (100). Furthermore, the invention refers to a white LED light source comprising an LED (100) and an inventive composite wavelength converter (1) mounted on a light emitting surface of the LED (100).

10 Claims, 9 Drawing Sheets

(51) Int. Cl.
    *C30B 19/12*     (2006.01)
    *C30B 29/28*     (2006.01)
    *C30B 31/04*     (2006.01)
    *G02B 5/20*     (2006.01)
    *H10H 20/01*     (2025.01)

(52) U.S. Cl.
    CPC .............. *C30B 29/28* (2013.01); *C30B 31/04* (2013.01); *G02B 5/208* (2013.01); *H10H 20/0361* (2025.01)

(56) References Cited

U.S. PATENT DOCUMENTS

2010/0033075 A1\*    2/2010    Naum ............... H01L 31/02322
                                                                                                          257/431
2014/0361328 A1    12/2014    Shimamura et al.

OTHER PUBLICATIONS

International Search Report for Application No. PCT/EP2020/084134 mailed Jan. 22, 2021, pp. 1-4.

Witkiewicz-Lukaszek, S. et al., "Epitaxial growth of composite scintillators based on Tb3 Al5 O12 : Ce single crystalline films and Gd3 Al2.5 Ga2.5 O12 : Ce crystal substrates," CrystEngComm. May 2018, pp. 3994-4002, vol. 20. XP055666915.

\* cited by examiner

COMPOSITE WAVELENGTH CONVERTER

CROSS-REFERENCE TO RELATED APPLICATIONS

The present application is a national phase entry under 35 U.S.C. § 371 of International Application No. PCT/EP2020/084134, filed on Dec. 1, 2020, published in English, which claims priority from European Patent Application No. 19213887.3, filed on Dec. 5, 2019, all of which are hereby incorporated herein by reference.

The invention refers to a composite wavelength converter for a light emitting diode (LED), to a method of preparation of a composite wavelength converter, and to a white LED light source.

Wavelength converters are known in prior art to convert a portion of the light of a given wavelength emitted by an LED into light having a higher wavelength, such that, as a result, a spectrum of white light is emitted.

According to the European Patent EP 2 670 817 B1, a wavelength converter comprising a monocrystalline substrate and a monocrystalline thin film produced thereon by pulsed laser deposition (PLD) is disclosed. As substrate, undoped yttrium aluminum garnet, i.e. $Y_3Al_5O_{12}$ garnet (YAG), and, as thin film, cerium-activated yttrium aluminum garnet, i.e. $Y_3Al_5O_{12}$:Ce garnet (YAG:Ce) or cerium-activated lutetium aluminum garnet, i.e. $Lu_3Al_5O_{12}$:Ce garnet (LuAG:Ce) are proposed. By providing a lattice mismatch between the substrate and the thin film, a compressive or tensile strain is induced which is used to produce a blue-shift or a red-shift in the emission of the thin film. However, the known wavelength converter has a limited quantum efficiency.

The object of the present invention is to overcome the disadvantages of the state of the art. In particular, it is intended to provide a composite wavelength converter having a particularly good quantum yield, a method of preparation of such a composite wavelength converter, and a white LED light source comprising an LED and such a composite wavelength converter.

In accordance with the invention, the composite wavelength converter comprises a substrate formed by a first layer of single crystalline garnet phosphor presenting first emission and excitation spectra. The first layer of single crystalline garnet phosphor (i.e. the substrate) has a cubic crystal structure, a first lattice parameter and oriented crystal planes. The first layer of single crystalline garnet phosphor (i.e. the substrate) contains a first activator. In the context of this application, an activator is preferably a substituent (i. e. the activator is provided as a constituent of a single crystalline garnet phosphor) or a dopant. The first activator is preferably a first dopant.

The inventive composite wavelength converter further comprises an epitaxial film formed by liquid phase epitaxy on the top and bottom of the substrate as a second layer of single crystalline garnet phosphor. The second layer of single crystalline garnet phosphor (i.e. the epitaxial film) contains the first activator and preferably at least one second activator. The first activator is preferably a first dopant and/or the second activator(s) is/are preferably (a) second dopant(s). The second layer of single crystalline garnet phosphor (i.e. the epitaxial film) presents second emission and excitation spectra and has a cubic crystal structure and a second lattice parameter. The second layer of single crystalline garnet phosphor (i.e. the epitaxial film) is arranged directly on the top and bottom of the substrate on the oriented crystalline planes of the substrate (i.e. of the first layer of single crystalline garnet phosphor).

Liquid-phase epitaxy (LPE) is a method to grow single crystalline layers from a melt-solution on single crystalline substrates. The material to be deposited is dissolved at temperatures well below its melting point in the melt of another material. Activators (preferably as dopants) are added to the melt. The substrate is cooled. The deposition of the material on the substrate is preferably performed at conditions that are close to the equilibrium between dissolution and deposition. The deposited layer is advantageously single crystalline.

In accordance with the invention, the second emission and excitation spectra are different from the first emission and excitation spectra. However, in particular, the excitation spectra of the substrate (i.e. the first layer of single crystalline garnet phosphor) and of the epitaxial film (i.e. second layer of single crystalline garnet phosphor) can be only slightly different.

Furthermore, in accordance with the invention, the difference between the first lattice parameter and the second lattice parameter results in a lattice mismatch within a range of about −2.0 and +2.0%, preferably of about −1.0 and +1.0%. The thickness of the epitaxial film on the top and on the bottom of the substrate, respectively, is at least 2 μm, preferably at least 20 μm, more preferably at least 30 μm, most preferably at least 50 μm.

The composite wavelength converter can be excited by the light of a given wavelength emitted by a light emitting diode (LED). In consequence, the composite wavelength converter is adapted to emit light of a higher wavelength such that, as a result, a spectrum of white light is emitted.

Advantageously, both, the substrate and the epitaxial film are excited by the light emitted by the LED. Preferably, each of the substrate and the epitaxial film, are adapted to emit light in consequence. Preferably, the epitaxial film is adapted to emit light of a wavelength range differing from the wavelength range emitted by the substrate.

According to a first example, blue light can be emitted by a light emitting diode (LED). In this case, the composite wavelength converter is preferably adapted to convert a portion (preferably between 40 and 80%, more preferably about 60%) of the blue light into light of a higher wavelength, preferably green, yellow, orange and/or red light, such that, as a result of mixing the light emitted by the LED and the light converted the composite wavelength converter, a spectrum of white light is emitted. Accordingly, by providing the composite wavelength converter, a blue LED results to become a white light emitting diode (white LED or WLED). The emission spectra of the substrate and of the epitaxial film can be tuned by adapting the composition of the substrate and of the epitaxial film, in particular by adapting the selection and concentration of the activators in the substrate and in the epitaxial film. By adapting these emission spectra, the CRI coordinates and the color temperature of the WLED can be tuned.

According to a second example, UV-light can be emitted by a light emitting diode (LED). In this case, the composite wavelength converter is adapted to convert essentially 100% of the UV-light into visible light such that, as a result, a spectrum of white light is emitted by the WLED. Accordingly, by providing the composite wavelength converter, a UV-LED results to become a WLED. Again, the emission spectra of the substrate and of the epitaxial film can be tuned by adapting the composition of the substrate and of the epitaxial film, in particular by adapting the selection and concentration of the activators in the substrate and in the epitaxial film. By adapting these emission spectra, the CRI coordinates and the color temperature of the WLED can be tuned.

The inventive composite wavelength converter provides both, a very low lattice mismatch and a particularly thick epitaxial layer. It has been shown that the inventive composite wavelength converter provides a very good quantum efficiency. The quantum yield of the inventive composite wavelength converter is at least 80%. Accordingly, high power white light emitting diodes (white LED or WLED) can be realized based on the inventive composite wavelength converter. Furthermore, the provision of both, substrate and the epitaxial film as light conversion layers, gives good variation possibilities regarding the spectrum. Thus, by the mixing of the emissions coming from the substrate and the epitaxial film, the CRI coordinates and the color temperature resulting by the inventive composite wavelength converter can be easily tuned.

According to an advantageous embodiment of the invention, the converter comprises one or two additional epitaxial films, namely a first and optionally a second additional epitaxial film.

Advantageously, the first additional epitaxial film is formed by liquid phase epitaxy as a third layer of single crystalline garnet phosphor with the first activator and preferably at least with one second activator. The first activator is preferably a first dopant and/or the second activator(s) is/are preferably (a) second dopant(s). Advantageously, the third layer of single crystalline garnet phosphor (i.e. the first additional epitaxial film) is arranged directly on the epitaxial film (i.e. on the second layer of single crystalline garnet phosphor) on the top and bottom side of the substrate, presents third emission and excitation spectra, and has a cubic crystal structure and a third lattice parameter.

The third layer of single crystalline garnet phosphor is preferably different from the second layer of single crystalline garnet phosphor. The third emission and excitation spectra are different from the first emission and excitation spectra and preferably different from the second emission and excitation spectra. However, in particular, the excitation spectra of the substrate (i.e. the first layer of single crystalline garnet phosphor) and/or of the epitaxial film (i.e. second layer of single crystalline garnet phosphor) and/or of the first additional epitaxial film (i.e. the third layer of single crystalline garnet phosphor) can be only slightly different.

Advantageously, the difference between the third lattice parameter and the second lattice parameter results in a lattice mismatch within a range of about −2.0 and +2.0%, preferably of about −1.0 and +1.0%. The thickness of the first additional epitaxial film (i.e. of the second layer of single crystalline garnet phosphor) on the top and on the bottom side of the substrate, respectively, is at least 2 μm, preferably at least 20 μm, more preferably at least 30 μm, most preferably at least 50 μm.

Advantageously, the second additional epitaxial film is formed by liquid phase epitaxy as a fourth layer of single crystalline garnet phosphor with the first activator and preferably at least with one second activator. The first activator is preferably a first dopant and/or the second activator(s) is/are preferably (a) second dopant(s). Advantageously, the fourth layer of single crystalline garnet phosphor (i.e. the second additional epitaxial film) is arranged directly on the first additional epitaxial film (i.e. on the third layer of single crystalline garnet phosphor) on the top and bottom side of the substrate, presents fourth emission and excitation spectra, and has a cubic crystal structure and a fourth lattice parameter, The fourth layer of single crystalline garnet phosphor is preferably different from the second and/or third layer of single crystalline garnet phosphor. The fourth emission and excitation spectra are different from the first emission and excitation spectra and preferably different from the second and/or third emission and excitation spectra. However, in particular, the excitation spectra of the substrate (i.e. the first layer of single crystalline garnet phosphor) and/or of the epitaxial film (i.e. second layer of single crystalline garnet phosphor) and/or of the first additional epitaxial film (i.e. the third layer of single crystalline garnet phosphor) and/or of the second additional epitaxial film (i.e. the fourth layer of single crystalline garnet phosphor) can be only slightly different.

Advantageously, the difference between the fourth lattice parameter and the third lattice parameter results in a lattice mismatch within a range of about −2.0 and +2.0%, preferably of about −1.0 and +1.0%. The thickness of the second additional epitaxial film on the top and on the bottom side of the substrate, respectively, is at least 2 μm, preferably at least 20 μm, more preferably at least 30 μm, most preferably at least 50 μm.

The second activator (or second activators) of the epitaxial film, of the first additional epitaxial film and/or of the second additional epitaxial film are preferably different and/or are preferably present in a different concentration.

Advantageously, the additional epitaxial film or the additional epitaxial films are excited by the light emitted by the LED and are cause to emit light of a wavelength range different to the wavelength range emitted by the substrate and/or epitaxial film. Thus, by the provision of one or two additional epitaxial film(s), the overall emission spectrum is improved. There are still more variation possibilities regarding the spectrum. Thus, by the mixing of the emissions coming from the substrate and the epitaxial film, the CRI coordinates and the color temperature resulting by the inventive composite wavelength converter can be easily tuned. Furthermore, very thick single crystalline epitaxial layers can be provided. It has been shown that the provision of one or two additional epitaxial film(s) enables a particularly good quantum efficiency. Accordingly, high power white light emitting diodes (white LED or WLED) can be realized based on the inventive composite wavelength converter.

According to a further advantageous embodiment of the invention, the first activator is $Ce^{3+}$ ions. The $Ce^{3+}$ ions are preferably present as a first dopant. In the substrate, the $Ce^{3+}$ ions preferably have a concentration from about 0.001 to about 1 mole %, more preferably from 0.05 to 0.15 mole %. In the epitaxial film, first additional epitaxial film and/or second additional epitaxial film, the $Ce^{3+}$ ions preferably have a concentration from about 0.001 to about 1 mole %, more preferably from 0.05 to 0.1 mole %. Alternatively, the first activator, in particular the first dopant, could be one from $Eu^{3+}$, $Pr^{3+}$, $Tb^{3+}$ and $Mn^{2+}$ ions.

According to a further advantageous embodiment of the invention, the second activator is one from $Eu^{3+}$, $Pr^{3+}$, $Tb^{3+}$ and $Mn^{2+}$ ions. The second activator is preferably present as second dopant. Accordingly, the second dopant is one from $R=Eu^{3+}$, $Pr^{3+}$, $Tb^{3+}$ and $Mn^{2+}$ ions. Alternatively, the second activator can be a substituent (i. e. the activator can be provided as a constituent of the respective garnet). The second activator, in particular the second dopant, preferably has a concentration from about 0.001 to about 5% of $Eu^{3+}$, Pr$^{3+}$ or Tb$^{3+}$ ions per mole, more preferably from 1 to 3 mole %, or from about 0.001 to about 3% of Mn$^{2+}$ ions per mole, more preferably from 0, 1 to 1 mole %.

In the epitaxial film, the first additional epitaxial film and/or the second additional epitaxial film, respectively, a different one from Eu$^{3+}$, Pr$^{3+}$, Tb$^{3+}$ and Mn$^{2+}$ ions is preferably present as second activator. Furthermore, several second activators selected, in particular several second dopants R, from Eu$^{3+}$, Pr$^{3+}$, Tb$^{3+}$ and Mn$^{2+}$ ions can be present in the epitaxial film, several second activators, in particular several second dopants R, selected from Eu$^{3+}$, Pr$^{3+}$, Tb$^{3+}$ and Mn$^{2+}$ ions can be present in the first additional epitaxial film and/or several second activators, in particular several second dopants R, selected from Eu$^{3+}$, Pr$^{3+}$, Tb$^{3+}$ and Mn$^{2+}$ ions can be present in the second additional epitaxial film.

Advantageously, the second activator, in particular the second dopant, is or the second activators, in particular the second dopants, are selected regarding the excitation wavelength (or excitation wavelength range) provided by the light emitting diode (LED). Accordingly, in case of a blue light emitting LED, Mn$^{2+}$ can be preferably selected. In case of an UV-light emitting LED, Eu$^{3+}$ can be preferably selected.

The additional provision of Tb$^{3+}$ is particularly advantageous in case of providing Eu$^{3+}$ and/or Mn$^{2+}$. Tb$^{3+}$ can be provided in the same layer as Eu$^{3+}$ and/or Mn$^{2+}$ or in a different layer, preferably in a neighboring layer. Tb$^{3+}$ can play an important role in the indirect excitation of Eu$^{3+}$ and/or Mn$^{2+}$.

Advantageously, the provision of one or more second activators, the possible selection of different ions as second activator, the possible provision of the second activator as dopant or as substituent, and/or the possible provision of several second activators in several layers still increase the variation possibilities regarding the resulting white light spectrum provided by the invention. Thus, by the mixing of the emissions coming from the substrate and the epitaxial film, the CRI coordinates and the color temperature resulting by the inventive composite wavelength converter can be easily tuned.

According to a further advantageous embodiment of the invention, the substrate is Y$_3$Al$_5$O$_{12}$:Ce garnet (YAG:Ce), Lu$_3$Al$_{5-s}$Ga$_s$O$_{12}$:Ce garnet (LuAG:Ce) or Gd$_3$Al$_{5-s}$Ga$_s$O$_{12}$:Ce garnet (GAGG:Ce). The composition parameter s is between 2.5 and 3. As concrete examples, the LuAG:Ce substrate is preferably Lu$_3$Al$_2$Ga$_3$O$_{12}$:Ce and the GAGG:Ce substrate is preferably Gd$_3$Al$_{2.5}$Ga$_{2.5}$O$_{12}$:Ce.

Advantageously, the substrate being Y$_3$Al$_5$O$_{12}$:Ce garnet (YAG:Ce) and/or being Gd$_3$Al$_{5-s}$Ga$_s$O$_{12}$:Ce garnet (GAGG:Ce), wherein s is between 2.5 and 3, in particular Gd$_3$Al$_{2.5}$Ga$_{2.5}$O$_{12}$:Ce, can be excited by a excitation wavelength of 440-465 nm, preferably of about 450 nm. Thus, these substrates are preferably chosen in the case of an excitation by a blue light emitting LED.

Advantageously, the substrate being Lu$_3$Al$_{5-s}$Ga$_s$O$_{12}$:Ce garnet (LuAG:Ce), wherein s is between 2.5 and 3, in particular Lu$_3$Al$_2$Ga$_3$O$_{12}$:Ce, can be excited by a the excitation wavelength, of 340-360 nm, preferably of about 345 nm. Thus, this substrate is preferably chosen in the case of an excitation by a UV-light emitting LED.

According to a further advantageous embodiment of the invention, the thickness of the substrate is between 0.3 and 1 mm, preferably between 0.45 and 0.5 mm.

According to a further advantageous embodiment of the invention, the epitaxial film, first additional epitaxial film and/or second additional epitaxial film is/are formed by a mixed garnet compound having a composition represented by a formula X=A$^1_3$B$^1_2$C$^1_3$O$_{12}$:Ce,R.

The constituents of the formula X are as follows: A$^1$ is Ca$^{2+}$ ions; B$^1$ is Sc$^{3+}$ or Al$^{3+}$ or Ga$^{3+}$ ions, C$^1$ is Si$^{4+}$ or Ge$^{4+}$ ions and R is the second dopant.

According to an alternative advantageous embodiment of the invention, the epitaxial film, first additional epitaxial film and/or second additional epitaxial film is/are formed by a mixed garnet compound having a composition represented by a formula Y=A$^1_{3-x}$A$^2_x$B$^1_{2-y}$B$^2_y$C$^1_{3-z}$C$^2_z$O$_{12}$:Ce,R.

The constituents of the formula Y are as follows: A$^1$ is Ca$^{2+}$ ions; A$^2$ is Y$^{3+}$, Lu$^{3+}$ La$^{3+}$, Tb$^{3+}$ and Gd$^{3+}$ ions; B$^1$ is Mg$^{2+}$ ions, B$^2$ is Sc$^{3+}$ or Al$_{3+}$ or Ga$^{3+}$ ions, C$^1$ is Si$^{4+}$ ions, C$^2$ is Ge$^{4+}$ ions and R is the second dopant.

The composition parameters of the formula Y are as follows: $0<x<1.0$, $0<y<2$, and $0<z<3$.

Tb$^{3+}$ ions are preferably either used as substituent (constituent of the garnet) A$^2$ or as first or second dopant. In the context of the present application, the Tb$^{3+}$ ions are called "activator" in these both cases. Accordingly, the epitaxial film, first additional epitaxial film and/or second additional epitaxial can be provided with three activators, preferably with Ce$^{3+}$, Tb$^{3+}$ and Eu$^3$*. As an example, the epitaxial film, first additional epitaxial film and/or second additional epitaxial can be Tb$_3$Al$_5$O$_{12}$:Ce,Eu. The Tb$^{3+}$ ions have an important role in the energy transfer from Ce$^{3+}$ ions to Eu$^{3+}$ ions (and also in the energy transfer from Ce$^{3+}$ ions to Mn$^{2+}$ ions). Therefore, providing Tb$^{3+}$ ions in a Eu$^{3+}$-doped film or in a Mn$^{2+}$-doped film causes an improved quantum efficiency.

According to a further advantageous embodiment of the invention, the thickness of the epitaxial film (i.e. of the second layer of single crystalline garnet phosphor) on the top and/or on the bottom side of the substrate, respectively, is at most 200 μm, preferably at most 100 μm.

Advantageously, the thickness of the first additional epitaxial film (i.e. of the third layer of single crystalline garnet phosphor) on the top and/or on the bottom side of the substrate, respectively, is at most 200 μm, preferably at most 100 μm.

Advantageously, the thickness of the second additional epitaxial film (i.e. of the fourth layer of single crystalline garnet phosphor) on the top and/or on the bottom side of the substrate, respectively, is at most 200 μm, preferably at most 100 μm.

By limiting the thickness of the thickness of the epitaxial film, of the first additional epitaxial film, and/or of the second additional epitaxial film a good quality of a single crystalline film can be ensured.

In accordance with the invention, the method of preparation of a composite wavelength converter for an LED comprises the following steps:

providing a substrate formed by a first layer of single crystalline garnet phosphor, having a cubic crystal structure, oriented crystal planes and containing a first activator, wherein the substrate is preferably Y$_3$Al$_5$O$_{12}$:Ce garnet (YAG:Ce), Lu$_3$Al$_{5-s}$Ga$_s$O$_{12}$:Ce garnet (LuAG:Ce, preferably Lu$_3$Al$_2$Ga$_3$O$_{12}$:Ce) or Gd$_3$Al$_{5-s}$Ga$_s$O$_{12}$:Ce garnet (GAGG:Ce, preferably Gd$_3$Al$_{2.5}$Ga$_{2.5}$O$_{12}$:Ce) with Ce$^{3+}$ ions being the first activator, wherein the composition parameter s is between 2.5 and 3, and depositing an epitaxial film forming a second layer of single crystalline garnet phosphor with the first activator and preferably at least with one second activator onto both sides of the oriented planes of the substrate using the liquid phase epitaxy method, wherein the thickness of the epitaxial film on each side of the substrate is at least 2 µm, preferably at least 20 µm, more preferably at least 30 µm, most preferably at least 50 µm.

In the context of this application, an activator is preferably a substituent (i.e. a constituent of a single crystalline garnet phosphor) or a dopant. The first activator is preferably a first dopant and/or the second activator(s) is/are preferably (a) second dopant(s).

Advantageously, the features of the inventive composite wavelength converter presented above also apply to the method of preparation of a composite wavelength converter. In particular, the substrate (first layer of single crystalline garnet phosphor) presents first emission and excitation spectra and has a first lattice parameter. The epitaxial film (second layer of single crystalline garnet phosphor) presents second emission and excitation spectra and has a second lattice parameter.

Advantageously, the second emission and excitation spectra are different from the first emission and excitation spectra. However, in particular, the excitation spectra of the substrate (i.e. the first layer of single crystalline garnet phosphor) and of the epitaxial film (i.e. second layer of single crystalline garnet phosphor) can be only slightly different.

Advantageously, the difference between the first lattice parameter and the second lattice parameter results in a lattice mismatch within a range of about −2.0 and +2.0%, preferably of about −1.0 and +1.0%.

The inventive preparation method provides a composite wavelength converter having both, a very low lattice mismatch and a particularly thick epitaxial layer. It has been shown that, accordingly, a very good quantum efficiency is realized. Furthermore, based on the inventive preparation method, high power white light emitting diodes (white LED or WLED) can be realized.

Advantageously, the first activator is $Ce^{3+}$ ions. The $Ce^{3+}$ ions are preferably used as a first dopant. In the substrate, the $Ce^{3+}$ ions preferably have a concentration from about 0.001 to about 1 mole %, more preferably from 0.05 to 0.15 mole %. In the epitaxial film, first additional epitaxial film and/or second additional epitaxial film, the $Ce^{3+}$ ions preferably have a concentration from about 0.001 to about 1 mole %, more preferably from 0.05 to 0.1 mole %. Alternatively, the first activator, in particular the first dopant, could be one from $Eu^{3+}$, $Pr^{3+}$, $Tb^{3+}$ and $Mn^{2+}$ ions.

According to an advantageous embodiment of the invention, the method of preparation comprises the additional step of depositing a first additional epitaxial film forming a third layer of single crystalline garnet phosphor with the first activator and preferably at least with one second activator (preferably directly) onto the epitaxial film (i.e. the second layer of single crystalline garnet phosphor) on both sides of the substrate using the liquid phase epitaxy method, wherein the thickness of the first additional epitaxial film (i.e. the third layer of single crystalline garnet phosphor) on each side of the substrate is at least 2 µm, preferably at least 20 µm, more preferably at least 30 µm, most preferably at least 50 µm.

Furthermore, the method of preparation optionally comprises the additional step of depositing a second additional epitaxial film forming a fourth layer of single crystalline garnet phosphor with the first activator and preferably at least with one second activator (preferably directly) onto the first additional epitaxial film (i.e. the third layer of single crystalline garnet phosphor) on both sides of the substrate using the liquid phase epitaxy method, wherein the thickness of the second additional epitaxial film (i.e. the fourth layer of single crystalline garnet phosphor) on each side of the substrate is at least 2 µm, preferably at least 20 µm, more preferably at least 30 µm, most preferably at least 50 µm.

The first activator is preferably a first dopant and/or the second activator(s) is/are preferably (a) second dopant(s).

Advantageously, the third layer of single crystalline garnet phosphor (i.e. the first additional epitaxial film) presents third emission and excitation spectra, and has a cubic crystal structure and a third lattice parameter.

The third layer of single crystalline garnet phosphor is preferably different from the second layer of single crystalline garnet phosphor. The third emission and excitation spectra are different from the first emission and excitation spectra and preferably different from the second emission and excitation spectra. However, in particular, the excitation spectra of the substrate (i.e. the first layer of single crystalline garnet phosphor) and/or of the epitaxial film (i.e. second layer of single crystalline garnet phosphor) and/or of the first additional epitaxial film (i.e. the third layer of single crystalline garnet phosphor) can be only slightly different.

Advantageously, the difference between the third lattice parameter and the second lattice parameter results in a lattice mismatch within a range of about −2.0 and +2.0%, preferably of about −1.0 and +1.0%.

Advantageously, the fourth layer of single crystalline garnet phosphor (i.e. the second additional epitaxial film) presents fourth emission and excitation spectra, and has a cubic crystal structure and a fourth lattice parameter.

The fourth layer of single crystalline garnet phosphor is preferably different from the second and/or third layer of single crystalline garnet phosphor. The fourth emission and excitation spectra are different from the first emission and excitation spectra and preferably different from the second and/or third emission and excitation spectra. However, in particular, the excitation spectra of the substrate (i.e. the first layer of single crystalline garnet phosphor) and/or of the epitaxial film (i.e. second layer of single crystalline garnet phosphor) and/or of the first additional epitaxial film (i.e. the third layer of single crystalline garnet phosphor) and/or of the second additional epitaxial film (i.e. the fourth layer of single crystalline garnet phosphor) can be only slightly different.

Advantageously, the difference between the fourth lattice parameter and the third lattice parameter results in a lattice mismatch within a range of about −2.0 and +2.0%, preferably of about −1.0 and +1.0%.

The second activator (or second activators) of the epitaxial film, of the first additional epitaxial film and/or of the second additional epitaxial film are preferably different and/or are preferably used in a different concentration.

By the provision of one or two additional epitaxial film(s), the overall emission spectrum is improved. There are still more variation possibilities regarding the spectrum. Thus, by the mixing of the emissions coming from the substrate and the epitaxial film, the CRI coordinates and the color temperature resulting by the inventive composite wavelength converter can be easily tuned. Furthermore, very thick single crystalline epitaxial layers can be provided. It has been shown that, by providing one or two additional epitaxial film(s), a particularly good quantum efficiency can be realized. Thus, based on the inventive preparation method, high power white light emitting diodes (white LED or WLED) can be realized.

According to a further advantageous embodiment of the invention, in the method of preparation, the substrate is embedded in a melt-solution containing flux oxides and garnet crystal forming components. The melt-solution preferably contains PbO and $B_2O_3$ as flux oxides or $Bi_2O_3$ and $B_2O_3$ as flux oxides.

The melt-solution preferably contains the garnet crystal forming components for producing the epitaxial film, first additional epitaxial film and/or second additional epitaxial film formed by a mixed garnet compound having a composition represented by a formula $$X=A^1{}_3B^1{}_2C^1{}_3O_{12}{:}Ce,R.$$

The constituents of the formula X are as follows: $A^1$ is $Ca^{2+}$ ions; $B^1$ is $Sc^{3+}$ or $Al^{3+}$ or $Ga^{3+}$ ions, $C^1$ is $Si^{4+}$ or $Ge^{4+}$ ions and R is the second dopant.

Alternatively, the melt-solution can contain the garnet crystal forming components for producing the epitaxial film, first additional epitaxial film and/or second additional epitaxial film formed by a mixed garnet compound having a composition represented by a formula $$Y=A^1{}_{3-x}A^2{}_xB^1{}_{2-y}B^2{}_yC^1{}_{3-z}C^2{}_zO_{12}{:}Ce,R.$$

The constituents of the formula Y are as follows: $A^1$ is $Ca^{2+}$ ions; $A^2$ is $Y^{3+}$, $Lu^{3+}$ $La^{3+}$, $Gd^{3+}$ and/or $Tb^{3+}$ ions; $B^1$ is $Mg^{2+}$ ions, $B^2$ is $Sc^{3+}$ or $Al^{3+}$ or $Ga^{3+}$ ions, $C^1$ is $Si^{4+}$ ions, $C^2$ is $Ge^{4+}$ ions and R is the second dopant.

The composition parameters of the formula Y are as follows: $0<x<1.0$, $0<y<2$, and $0<z<3$.

Advantageously, the second activator is one from $Eu^{3+}$, $Pr^{3+}$, $Tb^{3+}$ and $Mn^{2+}$ ions. The second activator is preferably used as second dopant. Accordingly, the second dopant is one from $R=Eu^{3+}$, $Pr^{3+}$, $Tb^{3+}$ and $Mn^{2+}$ ions. The second activator, however, also can be provided in the garnet as a substituent, e.g. as $A^2$ being $Tb^{3+}$ ions.

The second activator, in particular the second dopant R, preferably has a concentration from about 0.001 to about 5% of $Eu^{3+}$, $Pr^{3+}$ or $Tb^{3+}$ ions per mole, more preferably from 1 to 3 mole %, or from about 0.001 to about 3% of $Mn^{2+}$ ions per mole, more preferably from 0.1 to 1 mole %.

Advantageously, in the epitaxial film, the first additional epitaxial film and/or the second additional epitaxial film, respectively, a different one from $R=Eu^{3+}$, $Pr^{3+}$ $Tb^{3+}$ and $Mn^{2+}$ ions is preferably used as second dopant. Furthermore, several second activators, in particular several second dopants R, selected from $Eu^{3+}$ $Pr^{3+}$, $Tb^{3+}$ and $Mn^{2+}$ ions can be used in the epitaxial film, several second activators, in particular several second dopants R, selected from $Eu^{3+}$, $Pr^{3+}$ $Tb^{3+}$ and $Mn^{2+}$ ions can be used in the first additional epitaxial film and/or several second activators, in particular several second dopants R, selected from $Eu^{3+}$, $Pr^{3+}$, $Tb^{3+}$ and $Mn^{2+}$ ions can be used in the second additional epitaxial film.

According to a further advantageous embodiment of the invention, in the method of preparation, for producing the epitaxial film, first additional epitaxial film and/or second additional epitaxial film formed by the mixed garnet compound having a composition represented by a formula X, the melt-solution contains PbO, $B_2O_3$ as flux oxides or $Bi_2O_3$ and $B_2O_3$ as flux oxides; AO, $B^1{}_2O_3$, $C^1O_2$, $CeO_2$ and one of $R_2O_3$ or $R_4O_7$ or $RO_2$ oxides as garnet crystal forming components, wherein $R_2O_3$ is preferably $Eu_2O_3$, $R_4O_7$ is preferably $Pr_4O_7$ and/or $Tb_4O_7$, and $RO_2$ is preferably $MnO_2$,
chosen in the respective concentrations of 90 mole % of PbO or $Bi_2O_3$, 7.5 mole % of $B_2O_3$; 0.85 mole % of AO, 0.56 mole % of $B^1{}_2O_3$, 0.835 mole % of $C^1O_2$, 0.015 mole % of $CeO_2$ and 0.24 mole % of $R_2O_3$ or $R_4O_7$ or $RO_2$ oxides. There can be a variation in the ratio between the flux oxides and the garnet crystal forming components of ±10%, preferably ±5%. Alternatively or additionally, there can be a variation in each of the garnet crystal forming components of ±10%, preferably ±5%.

Advantageously, $Y_3Al_5O_{12}{:}Ce$ garnet (YAG:Ce) or $Lu_3Al_{5-s}Ga_sO_{12}{:}Ce$ garnet (LuAG:Ce) is used as substrate. The composition parameter s is between 2.5 and 3. As an example, preferably $Lu_3Al_2Ga_3O_{12}{:}Ce$ is used as substrate.

According to an alternative advantageous embodiment of the invention, in the method of preparation, for producing the epitaxial film, first additional epitaxial film and/or second additional epitaxial film formed by the mixed garnet compound having a composition represented by the formula Y, the melt-solution contains PbO, $B_2O_3$ as flux oxides or $Bi_2O_3$ and $B_2O_3$ as flux oxides; $A^1O$, $A^2{}_2O_3$, $B^1O$, $B^2{}_2O_3$; $C^1O_2$, $CeO_2$ and one of $R_2O_3$ or $R_4O_7$ or $RO_2$ oxides as garnet crystal forming components, wherein $R_2O_3$ is preferably $Eu_2O_3$, $R_4O_7$ is preferably $Pr_4O_7$ and/or $Tb_4O_7$, and $RO_2$ is preferably $MnO_2$, chosen in respective concentrations of 90 mole % of PbO or $Bi_2O_3$, 7.5 mole % of $B_2O_3$; 0.57 mole % of $A^1O$, 0.28 mole % of $A^2{}_2O_3$, 0.29 mole % of $B^1O$, 0.27 mole % of $B^2{}_2O_3$; 0.835 mole % of $C^1O_2$, 0.015 mole % of $CeO_2$ and 0.24 mole % of $R_2O_3$ or $R_4O_7$ or $RO_2$ oxides. There can be a variation in the ratio between the flux oxides and the garnet crystal forming components of ±10%, preferably ±5%. Alternatively or additionally, there can be a variation in each of the garnet crystal forming components of ±10%, preferably ±5%.

Advantageously, the substrate is $Gd_3Al_{5-s}Ga_sO_{12}{:}Ce$ garnet (GAGG:Ce). The composition parameter s is between 2.5 and 3.

According to a further advantageous embodiment of the invention, in the method of preparation, the deposition of the epitaxial film, first additional epitaxial film and/or second additional epitaxial film occurs at growth temperatures in the range of 850-1100° C., preferably at growth temperatures in the range of 950-1050° C.

Advantageously, the deposition of the epitaxial film, first additional epitaxial film and/or second additional epitaxial film occurs at an overcooling rate of the melt-solution in the range of 1 to 90° C., preferably in the range of 10 to 30° C. The overcooling rate is the difference between the temperature of saturation of melt-solution and temperature of growth.

According to a further advantageous embodiment of the invention, in the method of preparation, the deposition of the epitaxial film, first additional epitaxial film and/or second additional epitaxial film occurs at a growth rate in the range of 0.01 to 3 μm/min, preferably in the range of 0.1 to 0.5 μm/min.

According to a further advantageous embodiment of the invention, the substrate having the epitaxial film, first additional epitaxial film and/or second additional epitaxial film deposited thereon forms an epitaxial structure. The epitaxial structure is preferably a wafer. The wafer has preferably a diameter of 2-5 inch, most preferably of 3 inch. The epitaxy is preferably performed in a crucible having about the double size of the wafers. Accordingly, the crucible has preferably a diameter of about 4-10 inch, most preferably of about 6 inch.

Advantageously, the method comprises the additional step of cutting the epitaxial structure in a plurality of individual samples, each having identical optical properties. Preferably, the epitaxial structure is cut in 1000 to 10000 individual samples, more preferably in 2000 to 5000 individual samples. The individual samples are preferably rectangular cuboids, each having a square base plane of 2 mm*2 mm, preferably of 1 mm*1 mm. The cutting is preferably performed by a laser device.

In accordance with the invention, the white LED (WLED) light source comprises an LED and an inventive composite wavelength converter mounted on a light emitting surface of the LED. The composite wavelength converter converts at least a portion of light having a wavelength lying within a first range emitted by the LED into light having a wavelength lying in a second range. The wavelength lying within the second range is higher than the wavelength lying within the first range.

The LED preferably is adapted to emit a spectral distribution in the UV- and/or visible wavelength range. The first range is preferably a portion of the spectral distribution of the LED or the whole spectral distribution of the LED. The composite wavelength converter is adapted to be excited by absorbing a photon of a wavelength lying within the first range. The accordingly excited composite wavelength converter is adapted to emit a photon of a wavelength lying within the second range, wherein the wavelength lying within the second range is higher than the wavelength lying within the first range. Preferably, the composite wavelength converter is adapted to convert (at least a portion of) a first spectral distribution emitted by the LED into a second spectral distribution, wherein an average wavelength of the second spectral distribution is higher than an average wavelength of the first spectral distribution.

In particular, the LED can be adapted to emit blue light and/or radiation in the UV wavelength range (UV-light). Accordingly, the first range can belong to the blue wavelength range or to the UV wavelength range. Alternatively, the first range can include the blue wavelength range and/or the UV wavelength range.

Accordingly, it is possible to realize a white LED light source without providing a blue light emitting LED.

The second range preferably belongs to the visible wavelength range. The second range preferably includes the violet wavelength range, and/or blue wavelength range, and/or green wavelength range, and/or yellow wavelength range, and/or orange wavelength range, and/or red wavelength range. In particular, the second range can belong to the green wavelength range, and/or yellow wavelength range, and/or orange wavelength range, and/or red wavelength range.

Advantageously, the inventive white LED provides a very good quantum efficiency. Accordingly, the inventive white LED can be realized as a high-power device. Furthermore, the provision of both, substrate and the epitaxial film as light conversion layers, gives good variation possibilities regarding the spectrum. By the mixing of the emissions coming from the substrate and the epitaxial film, the CRI coordinates and the color temperature of the inventive WLED can be easily tuned.

According to a further advantageous embodiment of the invention, the wavelength lying within the first range belongs to the blue wavelength range. In this case, the composite wavelength converter is adapted to convert an appropriate portion of the light having the wavelength lying within the first range into light having the wavelength lying within the second range for creating a white light spectrum comprising the remaining portion of the light having the wavelength lying within the first range and the portion converted into light having the wavelength lying within the second range.

Preferably, the composite wavelength converter is adapted to convert between 40 and 80%, preferably about 60%, of the light having the wavelength lying within the first range into light having the wavelength lying within the second range. Accordingly, the wavelength lying within the first range, i.e. the excitation wavelength, is preferably 440-465 nm, more preferably about 450 nm. Preferably, $Y_3Al_5O_{12}$:Ce garnet (YAG:Ce) and/or $Gd_3Al_{5-s}Ga_sO_{12}$:Ce garnet (GAGG:Ce), wherein s is between 2.5 and 3, are chosen as substrate to be excited by this wavelength or this wavelength range, respectively.

According to an alternative advantageous embodiment of the invention, the wavelength lying within the first range belongs to the UV wavelength range, wherein the wavelength lying within the second range belongs to the visible wavelength range. In this case, the composite wavelength converter is adapted to convert essentially 100% of the light having the wavelength lying within the first range into light having the wavelength lying within the second range.

Accordingly, the wavelength lying within the first range, i.e. the excitation wavelength, is preferably 340-360 nm, more preferably about 345 nm. Preferably, $Lu_3Al_{5-s}Ga_sO_{12}$:Ce garnet (LuAG:Ce), wherein s is between 2.5 and 3, more preferably $Lu_3Al_2Ga_3O_{12}$:Ce, is chosen as substrate to be excited by this wavelength or this wavelength range, respectively.

The invention is now explained in more detail with reference to embodiment examples. There are shown in FIG. 1 a schematic structure of a white LED light source, FIG. 2 examples of a schematic structure of the composite wavelength converter, FIG. 3A XRD pattern of an example of an CSSG:Ce epitaxial film grown onto a GAGG:Ce substrate, FIG. 3B XRD pattern of an example of a CYMSSG:Ce epitaxial film grown onto a YAG:Ce substrate forming an inventive composite wavelength converter, FIG. 4A excitation spectra of $Ce^{3+}$ luminescence in three different substrates, FIG. 4B emission spectra of $Ce^{3+}$ luminescence in the same three different substrates, FIG. 5 a comparison of excitation (1, 2) and emission (3, 4) photoluminescence spectra of CYMSSG:Ce epitaxial film (1, 3) with YAG:Ce epitaxial film (2, 4), FIG. 6 a comparison of excitation (1, 2) and emission (3, 4) photoluminescence spectra of a composite wavelength converter formed by a of CYMSSG:Ce epitaxial film together with a YAG:Ce substrate (1, 3) in comparison with a YAG:Ce substrate alone (2, 4), FIG. 7 a comparison of excitation (1, 2) and emission (3, 4) photoluminescence spectra of a composite wavelength converter formed by a $Mn^{2+}$ co-doped CYMSSG:Ce epitaxial film together with a YAG:Ce substrate (1, 3) in comparison with a YAG:Ce substrate alone (2, 4), FIG. 8A chromaticity color coordinates of a YAG:Ce substrate alone, of a composite wavelength converter formed by a of CYMSSG:Ce epitaxial film grown on a YAG:Ce substrate (A), and of a composite wavelength converter formed by a $Mn^{2+}$ co-doped CYMSSG:Ce epitaxial film grown on a YAG:Ce substrate (B), FIG. 8B color temperatures of a YAG:Ce substrate alone, of a composite wavelength converter formed by a of CYMSSG:Ce epitaxial film grown on a YAG:Ce substrate (A), and of a composite wavelength converter formed by a $Mn^{2+}$ co-doped CYMSSG:Ce epitaxial film grown on a YAG:Ce substrate (B), and FIG. 9 a flow diagram illustrating the inventive method.

The FIG. 1 shows a schematic structure of a white light emitting diode (white LED or WLED) light source. A composite wavelength converter 1 is mounted on a light emitting diode (LED) 100. The LED 100 comprises a carrier 101 formed by sapphire ($Al_2O_3$). The carrier 101 is adapted to mount the composite wavelength converter 1 on the further layers of the LED 100. The LED 100 further comprises a n-doped layer 102 of GaN, an active layer 103 of (AlGaIn)N, a p-doped layer 104 of GaN, an adhesive and mirror layer 105, and an electroplating metal layer 106. Furthermore, the LED is provided with an ohmic contact 107.

The active layer 103 preferably emits blue light. In this case, the composite wavelength converter 1 is adapted to convert a portion (preferably about 60%) of the blue light into green, yellow, orange and red light such that, as a result of mixing the light emitted by the LED 100 and the light converted the composite wavelength converter 1, a spectrum of white light is emitted by the WLED.

Alternatively, the active layer 103 emits UV-light. In this case, the composite wavelength converter 1 is adapted to convert essentially 100% of the UV-light into visible light such that, as a result, a spectrum of white light is emitted by the WLED.

The FIG. 2 shows examples of a schematic structure of the composite wavelength converter 1. The inventive composite wavelength converters 1 are produced by liquid-phase epitaxy (LPE) by depositing one or more layers of single crystalline garnet phosphor onto a substrate 1 formed by a first layer of single crystalline garnet phosphor.

Figure 2A:
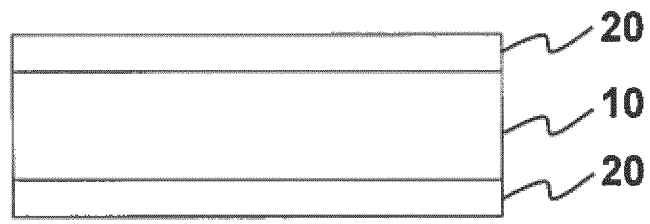

The FIG. 2A shows the schematic structure of a composite wavelength converter 1 having three layers. The substrate 10 is situated in the center of the three layers. The substrate 10 is enclosed by an epitaxial film 20 (second layer of single crystalline garnet phosphor) at its top side and at its bottom side. Due to the preparation by LPE, the epitaxial film 20 is identical at the top side and at the bottom side of the substrate 10.

EXAMPLE 1

| | |
|---|---|
| $Ca_3Sc_2Si_3O_{12}$:Ce, R | epitaxial film 20 |
| $Gd_3Al_{2.5}Ga_{2.5}O_{12}$:Ce (GAGG:Ce) | substrate 10 |
| $Ca_3Sc_2Si_3O_{12}$:Ce, R | epitaxial film 20 |

R=$Eu^{3+}$, $Pr^{3+}$, $Tb^{3+}$ or $Mn^{2+}$
lattice parameter of the substrate a=12.228 Å

EXAMPLE 2

| | |
|---|---|
| $Ca_2YMgScSi_3O_{12}$:Ce, R (CYMSSG:Ce, R) | epitaxial film 20 |
| $Y_3Al_5O_{12}$:Ce (YAG:Ce) | substrate 10 |
| $Ca_2YMgScSi_3O_{12}$:Ce, R (CYMSSG:Ce, R) | epitaxial film 20 |

R=$Eu^{3+}$, $Pr^{3+}$, $Tb^{3+}$ or $Mn^{2+}$
lattice parameter of the substrate a=12.0005 Å

EXAMPLE 3

| | |
|---|---|
| $Ca_2YMgScSi_3O_{12}$:Ce, R (CYMSSG:Ce, R) | epitaxial film 20 |
| $Lu_3Al_2Ga_3O_{12}$:Ce (LuAG:Ce) | substrate 10 |
| $Ca_2YMgScSi_3O_{12}$:Ce, R (CYMSSG:Ce, R) | epitaxial film 20 |

R=$Eu^{3+}$, $Pr^{3+}$, $Tb^{3+}$ or $Mn^{2+}$
lattice parameter of the substrate a=12.088

Figure 2B:
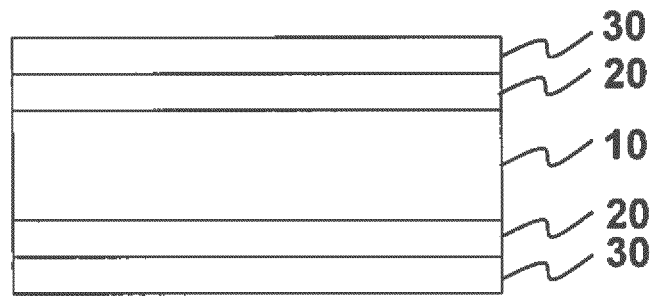

The FIG. 2B shows the schematic structure of a composite wavelength converter 1 having five layers. Again, the substrate 10 is situated in the center. The substrate 10 is enclosed by the epitaxial film 20 at its top side and at its bottom side. Onto the epitaxial film 20, a first additional epitaxial film 30 (third layer of single crystalline garnet phosphor) is deposited, both, at the top side and at the bottom side of the substrate 10. Due to the preparation by liquid-phase epitaxy (LPE), the first additional epitaxial film 30, as well, is identical at the top side and at the bottom side of the substrate 10.

EXAMPLE 4

| | |
|---|---|
| $Ca_2YMgScSi_3O_{12}$:Ce | first additional epitaxial film 30 |
| $Tb_3Al_5O_{12}$:Ce | epitaxial film 20 |
| $Y_3Al_5O_{12}$:Ce (YAG:Ce) | substrate 10 |
| $Tb_3Al_5O_{12}$:Ce | epitaxial film 20 |
| $Ca_2YMgScSi_3O_{12}$:Ce | first additional epitaxial film 30 |

In this example, the epitaxial film 20 at the top side of the substrate 10 and at the bottom side of the substrate 10 can alternatively be $Tb_3Al_5O_{12}$:Ce, R, wherein R=$Eu^{3+}$, $Pr^{3+}$ or $Mn^{2+}$.

EXAMPLE 5

| | |
|---|---|
| $Tb_3Al_5O_{12}$:Ce | first additional epitaxial film 30 |
| $Ca_2YMgScSi_3O_{12}$:Ce (CYMSSG:Ce) | epitaxial film 20 |
| $Y_3Al_5O_{12}$:Ce (YAG:Ce) | substrate 10 |
| $Ca_2YMgScSi_3O_{12}$:Ce (CYMSSG:Ce) | epitaxial film 20 |
| $Tb_3Al_5O_{12}$:Ce | first additional epitaxial film 30 |

In this example, the first additional epitaxial film 30 at both sides can alternatively be $Tb_3Al_5O_{12}$:Ce, R, wherein R=$Eu^{3+}$, $Pr^{3+}$ or $Mn^{2+}$.

EXAMPLE 6

| | |
|---|---|
| $Tb_2GdGa_2Al_3O_{12}$:Ce | first additional epitaxial film 30 |
| $Ca_2YMgScSi_3O_{12}$:Ce (CYMSSG:Ce) | epitaxial film 20 |
| $Y_3Al_5O_{12}$:Ce (YAG:Ce) | substrate 10 |
| $Ca_2YMgScSi_3O_{12}$:Ce (CYMSSG:Ce) | epitaxial film 20 |
| $Tb_2GdGa_2Al_3O_{12}$:Ce | first additional epitaxial film 30 |

In this example, the first additional epitaxial film 30 at both sides can alternatively be $Tb_2GdGa_2Al_3O_{12}$:Ce, R, wherein R=$Eu^{3+}$, $Pr^{3+}$ or $Mn^{2+}$.

Figure 2C:
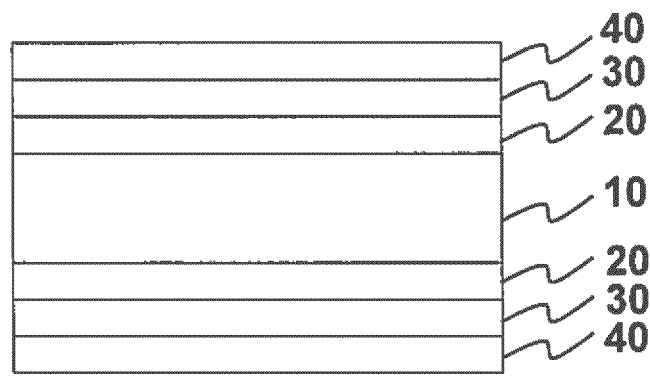

The FIG. 2C shows the schematic structure of a composite wavelength converter 1 having seven layers. The structure of substrate 10, epitaxial film 20 and first additional epitaxial film 30 corresponds to the structure shown in FIG. 2B. This structure is enclosed by a second additional epitaxial film 40 (fourth layer of single crystalline garnet phosphor) at its top side and at its bottom side. Due to the preparation by liquid-phase epitaxy (LPE), the second additional epitaxial film 40, as well, is identical at the top side and at the bottom side of the substrate 10.

The WLED of FIG. 1 is shown comprising a composite wavelength converter 1 having three layers according to the FIG. 2A. The inventive WLED, of course, can comprise any inventive composite wavelength converter 1 according to any one of the FIG. 2A, 2B or 2C.

Figure 3A:
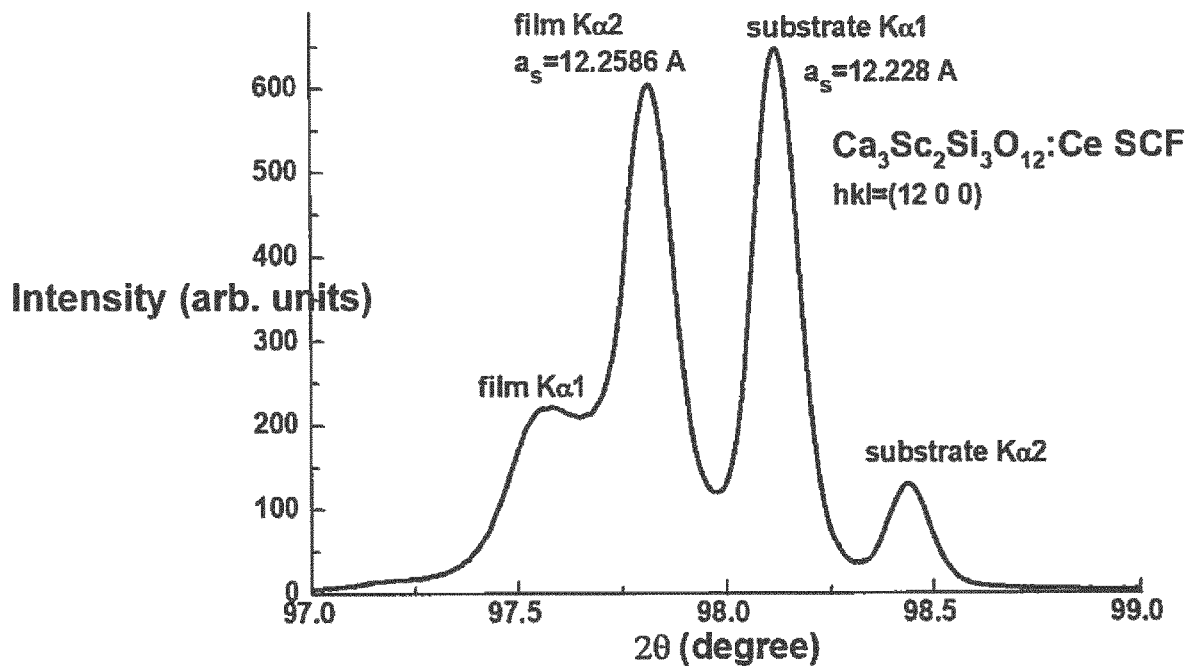
Figure 3B:
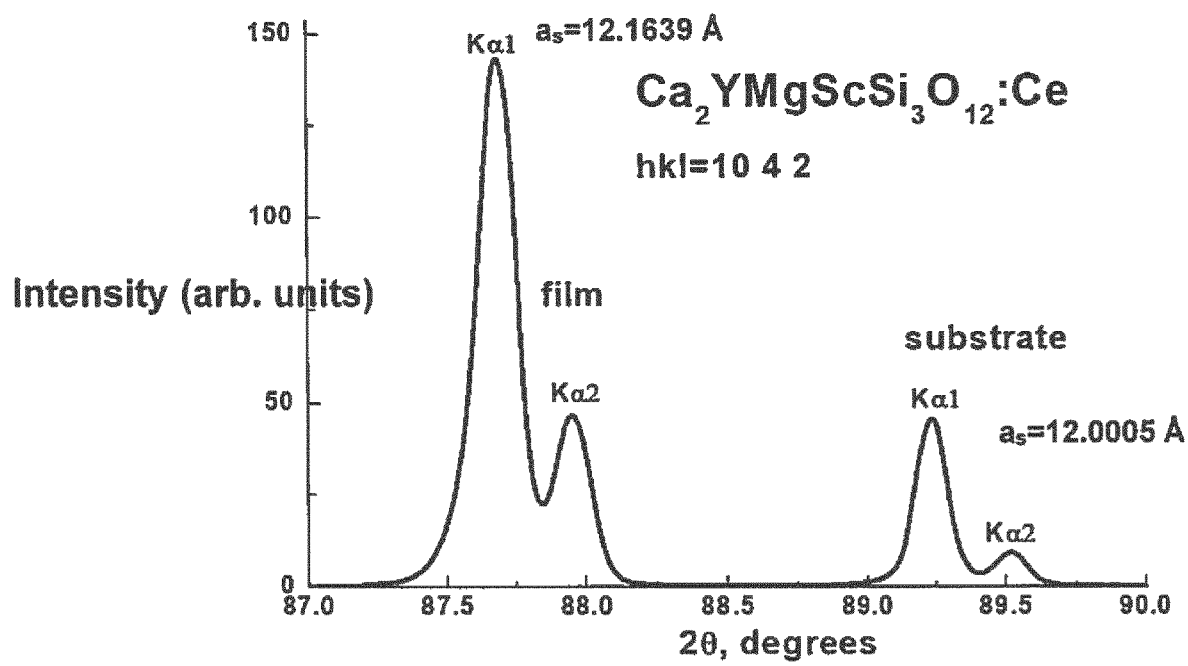

The FIGS. 3A and 3B show XRD patterns of a first and second example of an epitaxial film grown onto a substrate forming an inventive composite wavelength converter. The XRD patterns show pronounced peaks, the so-called characteristic lines. Each characteristic line is denominated according to the so-called Siegbahn notation. Accordingly, K-alpha 1 (Kα1) indicates the characteristic line of an electron transition from the highest 2p orbital of the L-shell to the innermost K-shell. K-alpha 2 (Kα2) indicates the characteristic line of an electron transition from the second 2p orbital of the L-shell to the innermost K-shell.

In the first example (FIG. 3A), a single crystalline film of $Ca_3Sc_2Si_3O_{12}$:Ce (CSSG:Ce) with thickness 10 μm was grown as an epitaxial film by LPE from a PbO based flux onto a single crystalline $Gd_3Al_{2.5}Ga_{2.5}O_{12}$:Ce (GAGG:Ce) garnet substrate (Example 1 from FIG. 2A). The XRD pattern of the first example refers to the (1200) plane. The lattice parameter of the epitaxial film results as a=12.2586 Å, the lattice parameter of the substrate results as a=12.228 Å. Accordingly, the lattice mismatch Δa/a accounts to 0.25%.

In the second example (FIG. 3B), a single crystalline film of $Ca_2YMgScSi_3O_{12}$:Ce (CYMSSG:Ce) was grown as an epitaxial film by LPE from a PbO based flux onto a single crystalline $Y_3Al_5O_{12}$:Ce (YAG:Ce) substrate (Example 2 from FIG. 2A). The XRD pattern of the second example refers to the (1042) plane. The lattice parameter of the epitaxial film results as a=12,1639 Å, the lattice parameter of the substrate results as a=12,0054 Å. Accordingly, the lattice mismatch Δa/a accounts to 1.32%.

Figure 4A:
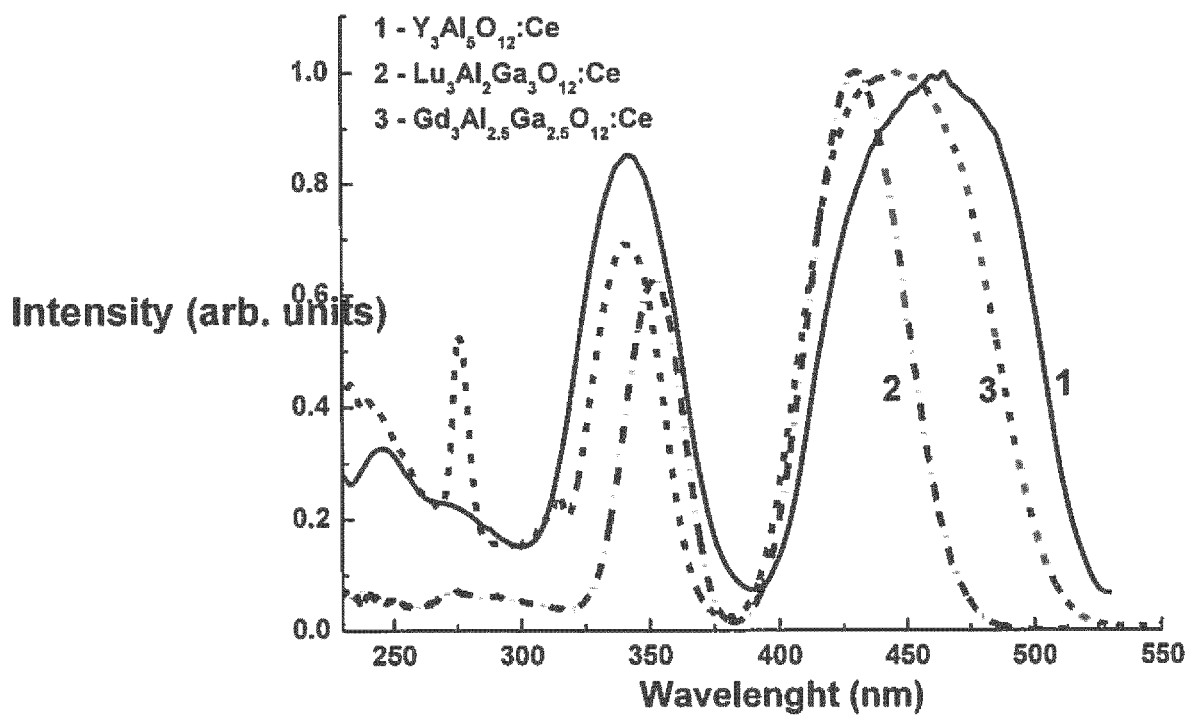
Figure 4B:
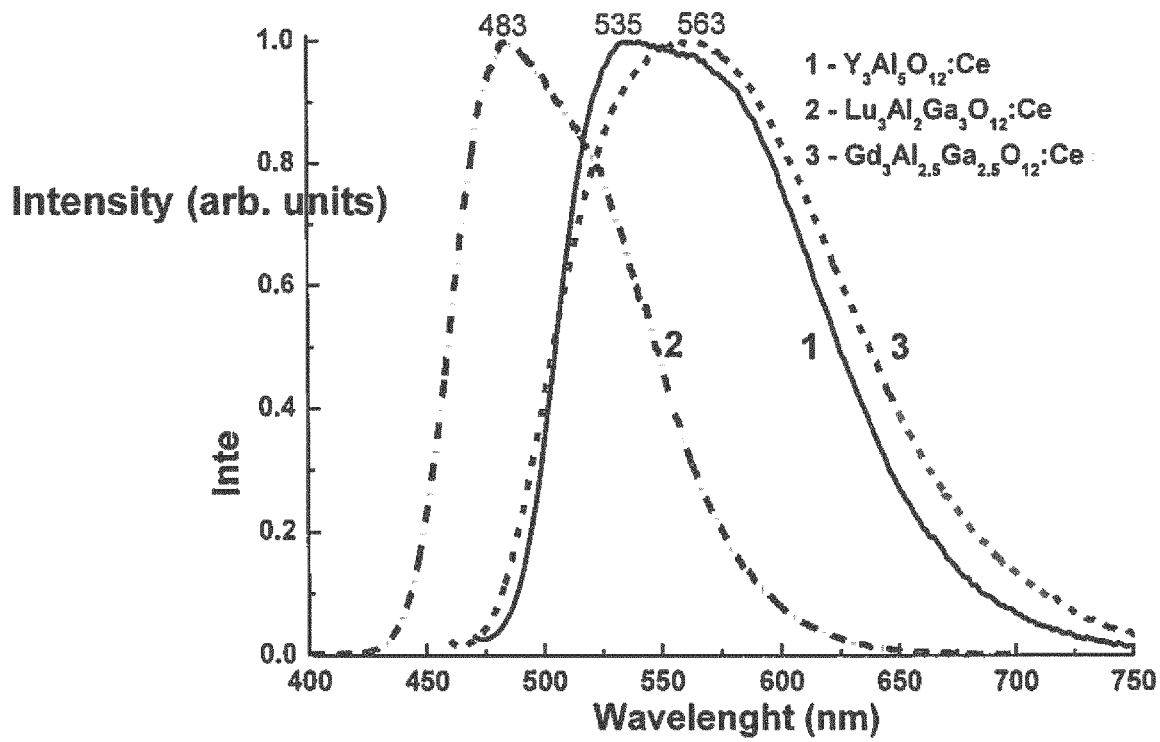

The FIGS. 4A and 4B show excitation (FIG. 4A) and emission (FIG. 4B) spectra of the $Ce^{3+}$ luminescence in three different substrates, namely:
(1): $Y_3Al_5O_{12}$:Ce substrate (YAG:Ce),
(2): $Lu_3Al_2Ga_3O_{12}$:Ce substrate (LuAG:Ce) and
(3): $Gd_3Al_{2.5}Ga_{2.5}O_{12}$:Ce substrate (GAGG:Ce).

According to the excitation spectra (FIG. 4A), each of the YAG:Ce substrate (1) and the GAGG:Ce substrate (3) show a peak in the range of an excitation wavelength of about 440-465 nm which corresponds to the wavelength range of a blue light emitting LED. The LuAG:Ce substrate (2) shows a peak in the range of an excitation wavelength of about 340-360 nm which corresponds to the wavelength range of a UV-light emitting LED.

According to the emission spectra (FIG. 4B), the YAG:Ce substrate (1) shows an emission peak of 535 nm (yellowish-green) with a broad shoulder to the yellow and orange wavelength range, the LuAG:Ce substrate (2) shows an emission peak of 483 nm (greenish-blue), and the GAGG:Ce substrate (3) shows a broad emission peak at 563 nm (yellow-green) which extends to the yellow and orange wavelength range.

Figure 5:
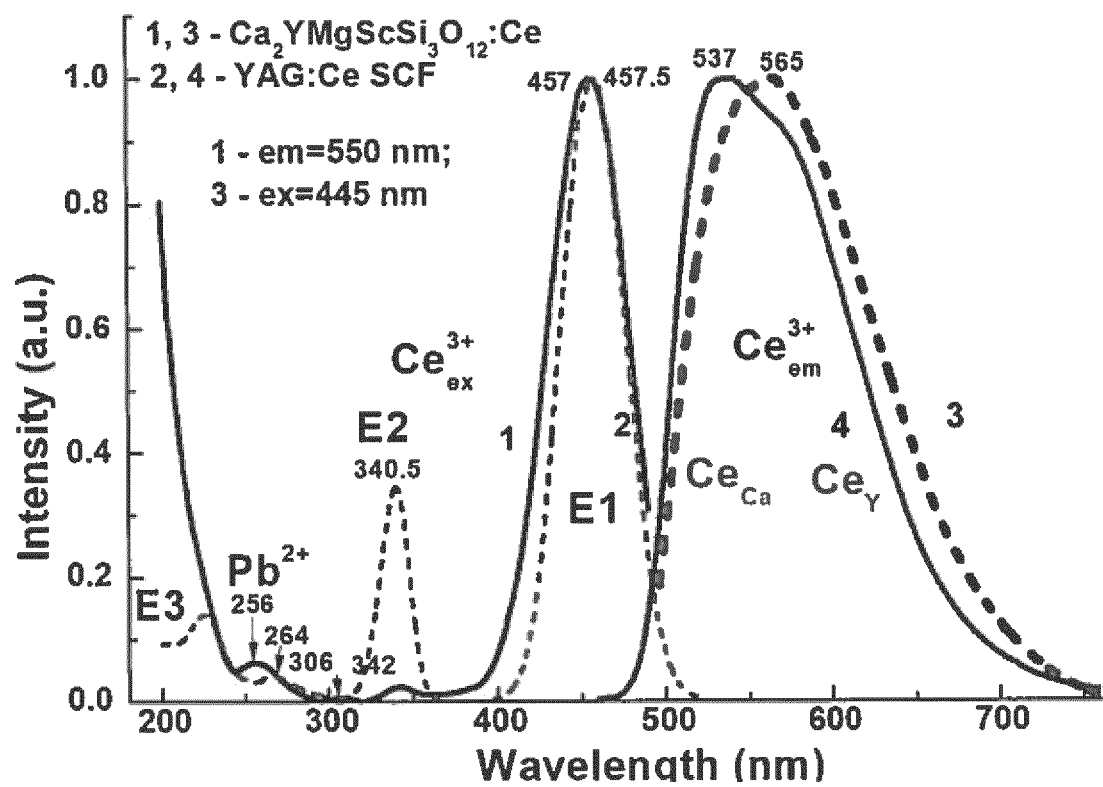

The FIG. 5 shows a comparison of photoluminescence (PL) excitation (1, 2) and emission (3, 4) spectra of a single crystalline epitaxial film of $Ca_2YMgScSi_3O_{12}$:Ce (CYMSSG:Ce) and a single crystalline $Y_3Al_5O_{12}$:Ce (YAG:Ce) substrate. FIG. 5 combines the respective excitation spectra (1, 2) (identified also by $Ce^{3+}_{ex}$) and the respective emission spectra (3, 4) (identified also by $Ce^{3+}_{em}$) in one plot. The spectra have been normalized. The respective spectra are as follows:

(1) excitation spectrum of CYMSSG:Ce,
(2) excitation spectrum of YAG:Ce,
(3) emission spectrum of CYMSSG:Ce,
(4) emission spectrum of YAG:Ce.

The excitation spectrum of CYMSSG:Ce (1) has been detected by a respective emission at 550 nm. The emission spectrum of CYMSSG:Ce (3) has been excited by a respective excitation at 445 nm. The PL measurements were performed at room temperature.

It is observed that the excitation band (1) of CYMSSG:Ce is broader than the excitation band (2) of YAG:Ce. Furthermore, it is observed that the emission band (3) of CYMSSG:Ce is broader than the emission band (4) of YAG:Ce.

The reason for the broader bands of CYMSSG:Ce is the formation of $Ce^{3+}$ multicenters in CYMSSG:Ce. Accordingly, a $Ce_{Ca}$-center is formed in the position of $Ca^{2+}$, and a $Ce_Y$-center is formed in the position of $Y^{3+}$. The formation of these centers causes an elongation of the PL emission spectrum into the orange and red wavelength range.

Furthermore, in the FIG. 5, the denominations E1, E2, E3 correspond to the absorption bands of cerium ions in the valence state 3+. The denomination $Pb^{2+}$ corresponds to the absorption bands of lead ions in the valence state 2+.

Figure 6:
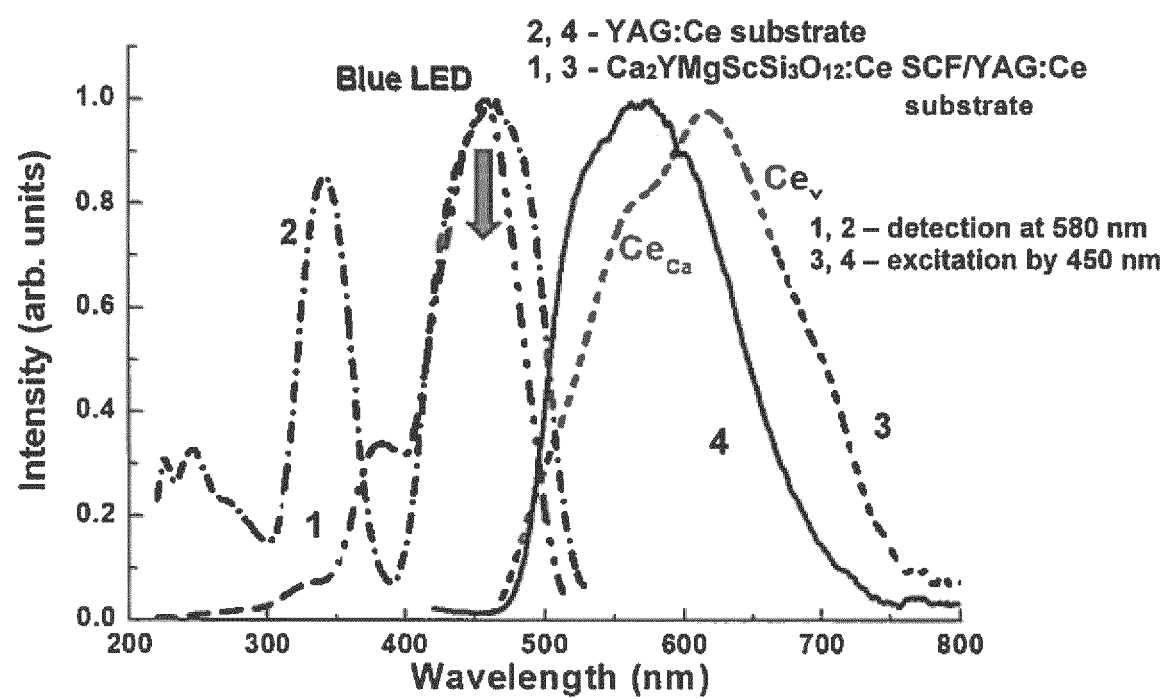

The FIG. 6 shows a comparison of photoluminescence (PL) excitation (1, 2) and emission (3,4) spectra of a composite wavelength converter formed by a single crystalline epitaxial film of $Ca_2YMgScSi_3O_{12}$:Ce (CYMSSG:Ce) together with a single crystalline $Y_3Al_5O_{12}$:Ce (YAG:Ce) substrate and a single crystalline $Y_3Al_5O_{12}$:Ce (YAG:Ce) substrate alone. The FIG. 6, again, combines the respective excitation spectra and the respective emission spectra in one plot. The spectra have been normalized. The respective spectra are as follows:

(1) excitation spectrum of the CYMSSG:Ce+YAG:Ce composite wavelength converter,
(2) excitation spectrum of the YAG:Ce substrate alone,
(3) emission spectrum of the CYMSSG:Ce+YAG:Ce composite wavelength converter,
(4) emission spectrum of the YAG:Ce substrate alone.

The excitation spectra (1, 2) are detected by a respective emission at 580 nm. The emission spectra (3, 4) are excited by a respective excitation at 450 nm. Accordingly, a blue LED is used for exciting (see "Blue LED"). The PL measurements were performed at room temperature.

Again, the emission band (3) of the CYMSSG:Ce+YAG:Ce composite wavelength converter is broader than the emission band (4) of the YAG:Ce substrate due to the formation of $Ce^{3+}$ multicenters in CYMSSG:Ce. Accordingly, a $Ce_{Ca}$-center is formed in the position of $Ca^{2+}$, and a $Ce_Y$-center is formed in the position of $Y^{3+}$. The formation of these centers causes an elongation of the PL emission spectrum into the orange and red wavelength range.

Figure 7:
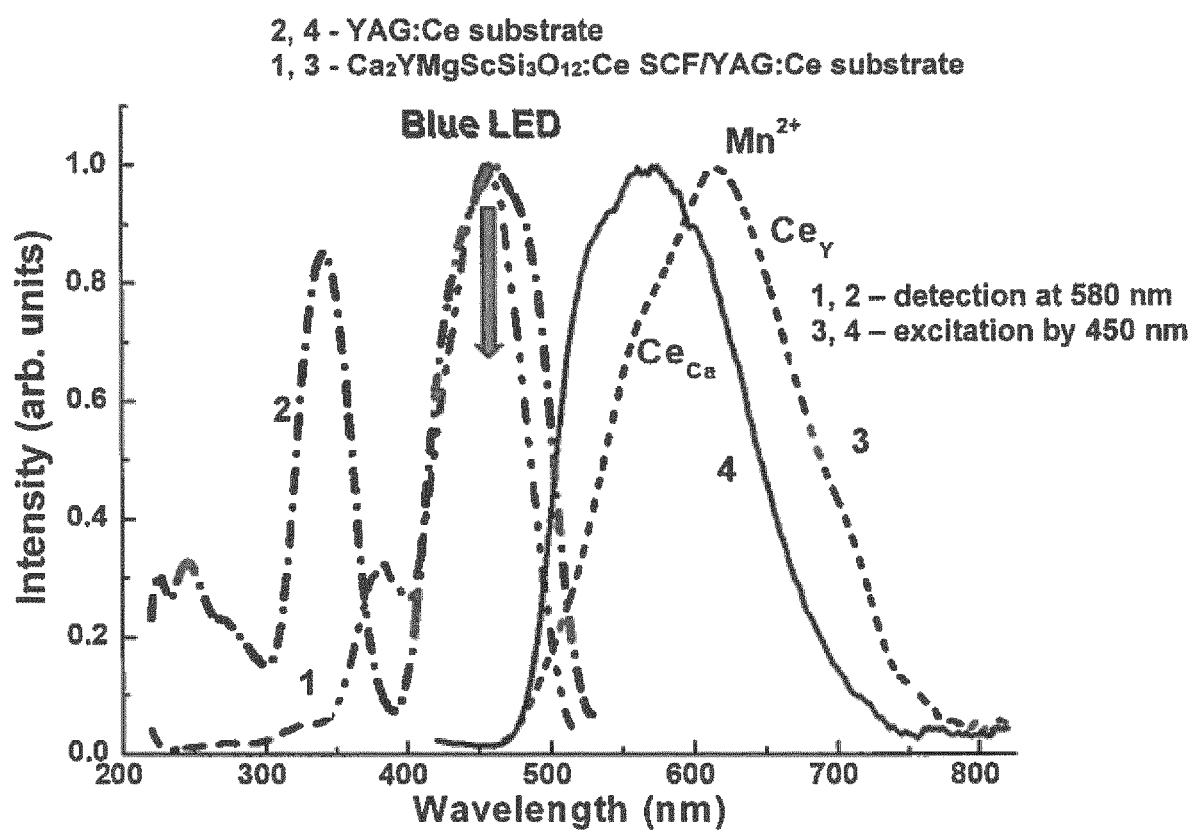

The FIG. 7 shows a comparison of photoluminescence (PL) excitation (1, 2) and emission (3,4) spectra of a composite wavelength converter formed by a single crystalline epitaxial film of $Ca_2YMgScSi_3O_{12}$:Ce, Mn (CYMSSG:Ce, Mn) together with a single crystalline $Y_3Al_5O_{12}$:Ce (YAG:Ce) substrate and a single crystalline $Y_3Al_5O_{12}$:Ce (YAG:Ce) substrate alone. The FIG. 7, again, combines the respective excitation spectra and the respective emission spectra in one plot. The spectra have been normalized. The respective spectra are as follows:

(1) excitation spectrum of the CYMSSG:Ce, Mn+YAG:Ce composite wavelength converter,
(2) excitation spectrum of the YAG:Ce substrate alone,
(3) emission spectrum of the CYMSSG:Ce, Mn+YAG:Ce composite wavelength converter,
(4) emission spectrum of the YAG:Ce substrate alone.

The excitation spectra (1, 2) have been detected by a respective emission at 580 nm. The emission spectra (3, 4) have been excited by a respective excitation at 450 nm. Accordingly, a blue LED is used for exciting (see "Blue LED"). The PL measurements were performed at room temperature.

The comparison of FIG. 7 differs from the comparison of FIG. 6 in that the epitaxial film of composite wavelength converter is co-doped with $Mn^{2+}$ ions. Thus, in FIG. 7, the single crystalline epitaxial film of $Ca_2YMgScSi_3O_{12}$:Ce, Mn (CYMSSG:Ce, Mn) provides a second activator.

Again, the emission band (3) of the CYMSSG:Ce, Mn+YAG:Ce composite wavelength converter is broader than the emission band (4) of the YAG:Ce substrate due to the formation of $Ce^{3+}$ multicenters in CYMSSG:Ce. Accordingly, a $Ce_{Ca}$-center is formed in the position of $Ca^{2+}$, and a $Ce_Y$-center is formed in the position of $Y^{3+}$. The formation of these centers causes an elongation of the emission spectrum into the orange and red wavelength range.

Furthermore, an effective energy transfer from the $Ce^{3+}$ ions to the $Mn^{2+}$ ions causes a further elongation of the emission spectrum (3) of the CYMSSG:Ce, Mn+YAG:Ce composite wavelength converter into the orange and partly red wavelength range.

Thus, advantageously, $Ce^{3+}$ doped and $Eu^{3+}$, $Pr^{3+}$, $Tb^{3+}$ and $Mn^{2+}$ co-doped $Ca_2YMgScSi_3O_{12}$ and $Ca_3Sc_2Si_3O_{12}$ SCFs are grown using the LPE method onto $Ce^{3+}$ doped YAG:Ce or LuAG:Ce and GAGG:Ce substrates, respectively.

Advantageously, the substrate emits mainly in the yellow range, and the $Ce^{3+}$ doped and rare-earth or transition metal doped $Ca_2YMgScSi_3O_{12}$ and $Ca_3Sc_2Si_3O_{12}$ epitaxial films emit in the orange-red ranges. Accordingly, a high-power white LED can be realized.

By the mixing of the emissions coming from the substrate and the epitaxial film, the CRI coordinates and the color temperature resulting by the inventive composite wavelength converter and/or the CRI coordinates and the color temperature of the inventive WLED can be easily tuned.

Figure 8A:
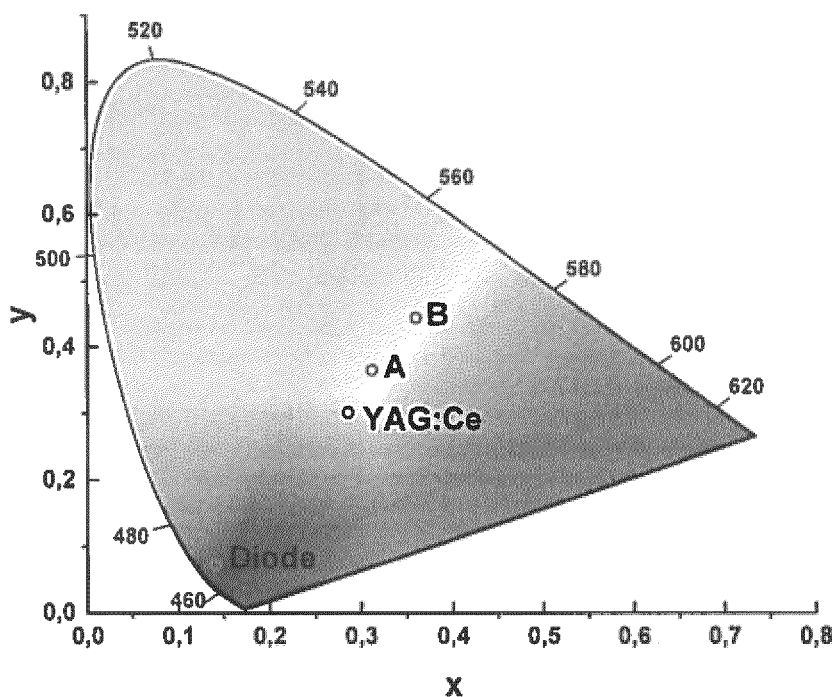
Figure 8B:
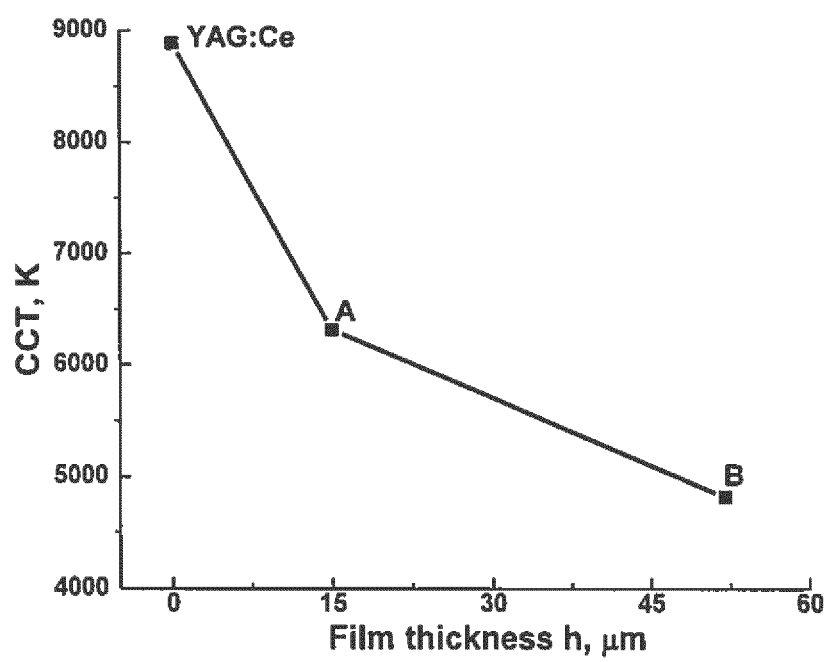

The FIGS. 8A and 8B show chromaticity color coordinates (FIG. 8A) and color temperatures (FIG. 8B) of the following converters:

YAG:Ce: light converting substrate with thickness h=550 μm;

A: single crystalline epitaxial film of $Ca_2YMgScSi_3O_{12}$: Ce (CYMSSG:Ce) with thickness h=15 μm grown onto both side of YAG:Ce light converting substrate with thickness h=550 μm and B: single crystalline epitaxial film of $Ca_2YMgScSi_3O_{12}$: Ce,Mn (CYMSSG:Ce,Mn) with thickness of h=52 μm grown onto both side of YAG:Ce light converting substrate with thickness h=550 μm.

A 464 nm LED emitting light in the blue wavelength range (see "Diode" in FIG. 8A) has been used for the excitation of the respective converters.

It is observed from the FIG. 8 that in the succession YAG:Ce-A-B, an increasingly warmer white impression is realized.

Figure 9:
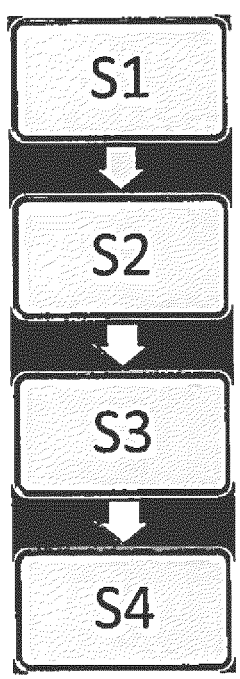

The FIG. 9 shows a flow diagram illustrating the inventive method of preparation of a composite wavelength converter for an LED.

In a first step S1, a substrate 10 is provided. For example, the substrate is $Y_3Al_5O_{12}$:Ce garnet (YAG:Ce), $Lu_3Al_2Ga_3O_{12}$:Ce garnet (LuAG:Ce) or $Gd_3Al_{2.5}Ga_{2.5}O_{12}$:Ce garnet (GAGG:Ce) with $Ce^{3+}$ ions being the first activator. In particular, the $Ce^{3+}$ ions are provided as the first dopant. The $Ce^{3+}$ ions have a concentration of for example 0.1 mole %.

In a step S2, an epitaxial film 20 is deposited onto both sides of the oriented planes of the substrate 10 using the liquid phase epitaxy method. Accordingly, the substrate 10 is embedded in a melt-solution containing flux oxides and garnet crystal forming components. The melt-solution, for example, contains PbO and $B_2O_3$ as flux oxides. The thickness of the epitaxial film 20 on each side of the substrate 10 is for example 100 μm. The epitaxial film 20 is provided with $Ce^{3+}$ ions as first activator (first dopant). The $Ce^{3+}$ ions have a concentration of for example 0.1 mole %. Furthermore, the epitaxial film 20 is provided with a second activator selected from one of $Eu^{3+}$, $Pr^{3+}$, $Tb^{3+}$ and $Mn^{2+}$ ions. The second activator can be a second dopant or a substituent (garnet constituent). The second activator has a concentration for example 2% of $Eu^{3+}$, $Pr^{3+}$ or $Tb^{3+}$ ions per mole, or 0.7% of $Mn^{2+}$ ions per mole. The epitaxial film 20, for example, could have one of the following compositions: $Tb_3Al_5O_{12}$:Ce,Eu, $Tb_3Al_5O_{12}$:Ce,Pr or $Tb_3Al_5O_{12}$:Ce,Mn; $Ca_2YMgScSi_3O_{12}$:Ce,Mn, $Ca_2YMgScSi_3O_{12}$:Ce,Eu or $Ca_3Sc_2Si_3O_{12}$:Ce,Pr.

In an optional step S3, a first additional epitaxial film 30 is deposited directly onto the epitaxial film 20 on both sides of the substrate 10 using the liquid phase epitaxy method. The thickness of the first additional epitaxial film 30 on each side of the substrate is for example 100 μm. Further optionally, a second additional epitaxial film 40 can be deposited directly onto the first additional epitaxial film 30 on both sides of the substrate 10 using the liquid phase epitaxy method. The thickness of the second additional epitaxial film 40 on each side of the substrate 10 is for example 100 μm. Advantageously, the first additional epitaxial film 30 (and optionally the second additional epitaxial film 40) is provided with $Ce^{3+}$ ions as first activator (first dopant). The $Ce^{3+}$ ions have a concentration of for example 0.1 mole %. Furthermore, the first additional epitaxial film 30 is provided with a second activator selected from one of $Eu^{3+}$ $Pr^{3+}$, $Tb^{3+}$ and $Mn^{2+}$ ions. Optionally, the second additional epitaxial film 40 is provided with a second activator selected from one of $Eu^{3+}$, $Pr^{3+}$, $Tb^{3+}$ and $Mn^{2+}$ ions. The second activator can be a second dopant or a substituent (garnet constituent). The second activator has a concentration for example 2% of $Eu^{3+}$ $Pr^{3+}$ or $Tb^{3+}$ ions per mole, or 0.7% of $Mn^{2+}$ ions per mole. The first additional epitaxial film 30, for example, could have one of the following compositions: $Tb_3Al_5O_{12}$:Ce,Eu, $Tb_3Al_5O_{12}$:Ce,Pr or $Tb_3Al_5O_{12}$:Ce,Mn; $Ca_2YMgScSi_3O_{12}$: Ce,Mn, $Ca_2YMgScSi_3O_{12}$:Ce,Eu or $Ca_3Sc_2Si_3O_{12}$:Ce,Pr. Optionally, the second additional epitaxial film 40 could have one of the following compositions: $Tb_3Al_5O_{12}$:Ce,Eu, $Tb_3Al_5O_{12}$:Ce,Pr or $Tb_3Al_5O_{12}$:Ce,Mn, $Ca_2YMgScSi_3O_{12}$: Ce,Mn, $Ca_2YMgScSi_3O_{12}$:Ce,Eu or $Ca_3Sc_2Si_3O_{12}$:Ce,Pr.

The step S2 (and optionally S3), i.e. the deposition of the epitaxial film 20, first additional epitaxial film 30 and/or second additional epitaxial film 40, occurs at growth temperatures of about 1000° C., at an overcooling rate of the melt-solution of about 20° C., and at a growth rate of about 0.3 μm/min.

The substrate 10 having the epitaxial film 20, first additional epitaxial film 30 and/or second additional epitaxial film 40 deposited thereon forms an epitaxial structure. The epitaxial structure is for example a wafer of a diameter of 3 inch. The epitaxy is performed in a crucible having a diameter of about 6 inch.

In a step S4, the epitaxial structure is cut in a plurality of individual samples, each having identical optical properties.

Preferably, the epitaxial structure is cut in 4000 individual samples being rectangular cuboids, each having a square base plane of 2 mm*2 mm. The cutting is for example performed by a laser device.

REFERENCE SIGNS 1 composite wavelength converter
10 substrate
20 epitaxial film
30 first additional epitaxial film
40 second additional epitaxial film
100 LED
101 carrier
102 n-doped layer of GaN
103 active layer of (AlGaIn)N
104 p-doped layer of GaN
105 adhesive and mirror layer
106 electroplating metal layer
107 ohmic contact

The invention claimed is:

1. A composite wavelength converter for an LED, comprising
   a substrate (10) formed by a first layer of single crystalline garnet phosphor presenting first emission and excitation spectra, having a cubic crystal structure, a first lattice parameter and oriented crystal planes, wherein the substrate (10) contains a first activator, and
   an epitaxial film (20) formed by liquid phase epitaxy on the top and bottom of the substrate (10) as a second layer of single crystalline garnet phosphor with the first activator, presenting second emission and excitation spectra, having a cubic crystal structure and a second lattice parameter, wherein the epitaxial film (20) is arranged directly on the top and bottom of the substrate (10) on the oriented crystalline planes of the substrate (10),
   wherein the second emission and excitation spectra are different from the first emission and excitation spectra,
   wherein the difference between the first lattice parameter and the second lattice parameter results in a lattice mismatch within a range of −2.0 to +2.0%, and
   wherein the thickness of the epitaxial film (20) on the top of the substrate (10) is at least 2 μm and the thickness of the epitaxial film (20) on the bottom of the substrate (10) is at least 2 μm.

2. The converter according to claim 1, wherein the converter (1) comprises one or two additional epitaxial films, namely a first (30) and optionally a second (40) additional epitaxial film,
   wherein the first additional epitaxial film (30) is formed by liquid phase epitaxy as a third layer of single crystalline garnet phosphor with the first activator, arranged directly on the epitaxial film (20) on the top and bottom side of the substrate (10), presenting third emission and excitation spectra, having a cubic crystal structure and a third lattice parameter,
   wherein the third emission and excitation spectra are different from the first emission and excitation spectra,
   wherein the difference between the third lattice parameter and the second lattice parameter results in a lattice mismatch within a range of −2.0 to +2.0%, and wherein the thickness of the first additional epitaxial film (30) on the top side of the substrate (10) is at least 2 μm and the thickness of the first additional epitaxial film (30) on the bottom side of the substrate (10) is at least 2 μm,
   wherein the second additional epitaxial film (40) is formed by liquid phase epitaxy as a fourth layer of single crystalline garnet phosphor with the first activator, arranged directly on the first additional epitaxial film (30) on the top and bottom side of the substrate (10), presenting fourth emission and excitation spectra, having a cubic crystal structure and a fourth lattice parameter,
   wherein the fourth emission and excitation spectra are different from the first emission and excitation spectra, and
   wherein the difference between the fourth lattice parameter and the third lattice parameter results in a lattice mismatch within a range of −2.0 to +2.0%, and wherein the thickness of the second additional epitaxial film (40) on the top side of the substrate (10) is at least 2 μm and the thickness of the second additional epitaxial film (40) on the bottom side of the substrate (10) is at least 2 μm.

3. The converter according to claim 1, wherein the first activator is $Ce^{3+}$ ions.

4. The converter according to claim 1, wherein the second activator is one from $Eu^{3+}$, $Pr^{3+}$, $Tb^{3+}$ and $Mn^{2+}$ ions.

5. The converter according to claim 4, wherein the epitaxial film (20), first additional epitaxial film (30) and/or second additional epitaxial film (40) is/are formed by a mixed garnet compound having a composition
   represented by a formula $X=A^1_3B^1_2C^1_3O_{12}$:Ce,R, wherein $A^1$ is $Ca^{2+}$ ions; $B^1$ is $Sc^{3+}$ or $Al^{3+}$ or $Ga^{3+}$ ions, $C^1$ is $Si^{4+}$ or $Ge^{4+}$ ions and R is the second dopant, or represented by a formula $Y=A^1_{3-x}A^2_xB^1_{2-y}B^2_yC^1_{3-z}C^2_zO_{12}$:Ce,R, wherein $A^1$ is $Ca^{2+}$ ions; $A^2$ is $Y^{3+}$, $Lu^{3+}$, $La^{3+}$, $Tb^{3+}$ and $Gd^{3+}$ ions; $B^1$ is $Mg^{2+}$ ions, $B^2$ is $Sc^{3+}$ or $Al^{3+}$ or $Ga^{3+}$ ions, $C^1$ is $Si^{4+}$ ions, $C^2$ is $Ge^{4+}$ ions and R is the second dopant, wherein $0<x<1.0$, $0<y<2$, and $0<z<3$.

6. The converter according to claim 1, wherein the substrate (10) is $Y_3Al_5O_{12}$:Ce garnet, $Lu_3Al_{5-s}Ga_sO_{12}$:Ce garnet or $Gd_3Al_{5-s}Ga_sO_{12}$:Ce garnet, wherein s is between 2.5 and 3.

7. The converter according to claim 1, wherein the thickness of the substrate (10) is between 0.3 and 1 mm.

8. The converter according to claim 1, wherein the thickness of the epitaxial film (20) on the top side of the substrate (10) is at most 200 μm, and/or the thickness of the epitaxial film (20) on the on the bottom side of the substrate (10) is at most 200 μm,
   wherein the thickness of the first additional epitaxial film (30) on the top side of the substrate (10) is at most 200 μm, and/or the thickness of the epitaxial film (30) on the bottom side of the substrate (10) is at most 200 μm, and/or
   wherein the thickness of the second additional epitaxial film (40) on the top side of the substrate (10) is at most 200 μm, and/or the thickness of the second additional epitaxial film (40) on the bottom side of the substrate (10) is at most 200 μm.

9. A white LED light source comprising an LED (100) and a composite wavelength converter (1) mounted on a light emitting surface of the LED (100), the converter (1) converting at least a portion of light having a wavelength lying within a first range emitted by the LED (100) into light having a wavelength lying in a second range, wherein the wavelength lying within the second range is higher than the wavelength lying within the first range the composite wavelength converter comprising
a substrate (10) formed by a first layer of single crystalline garnet phosphor presenting first emission and excitation spectra, having a cubic crystal structure, a first lattice parameter and oriented crystal planes, wherein the substrate (10) contains a first activator, and
an epitaxial film (20) formed by liquid phase epitaxy on the top and bottom of the substrate (10) as a second layer of single crystalline garnet phosphor with the first activator, presenting second emission and excitation spectra, having a cubic crystal structure and a second lattice parameter, wherein the epitaxial film (20) is arranged directly on the top and bottom of the substrate (10) on the oriented crystalline planes of the substrate (10),
wherein the second emission and excitation spectra are different from the first emission and excitation spectra,
wherein the difference between the first lattice parameter and the second lattice parameter results in a lattice mismatch within a range of −2.0 to +2.0%, and
wherein the thickness of the epitaxial film (20) on the top of the substrate (10) is at least 2 μm, and the thickness of the epitaxial film (20) on the bottom of the substrate (10) is at least 2 μm.

10. The white LED light source according to claim 9, wherein the wavelength lying within the first range belongs to the blue wavelength range, and wherein the converter (1) is adapted to convert an appropriate portion of the light having the wavelength lying within the first range into light having the wavelength lying within the second range for creating a white light spectrum comprising the remaining portion of the light having the wavelength lying within the first range and the portion converted into light having the wavelength lying within the second range, or
wherein the wavelength lying within the first range belongs to the UV wavelength range, wherein the wavelength lying within the second range belongs to the visible wavelength range, and wherein the converter (1) is adapted to convert essentially 100% of the light having the wavelength lying within the first range into light having the wavelength lying within the second range.

* * * * *